United States Patent
Shih

(10) Patent No.: US 11,728,277 B2
(45) Date of Patent: Aug. 15, 2023

(54) METHOD FOR MANUFACTURING SEMICONDUCTOR STRUCTURE HAVING VIA THROUGH BONDED WAFERS

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/529,507

(22) Filed: Nov. 18, 2021

(65) Prior Publication Data
US 2022/0077068 A1  Mar. 10, 2022

Related U.S. Application Data

(62) Division of application No. 16/983,533, filed on Aug. 3, 2020, now Pat. No. 11,502,038.

(51) Int. Cl.
*H01L 23/538* (2006.01)
*H01L 21/768* (2006.01)

(52) U.S. Cl.
CPC .... *H01L 23/5384* (2013.01); *H01L 21/76802* (2013.01); *H01L 21/76877* (2013.01); *H01L 23/5386* (2013.01)

(58) Field of Classification Search
CPC ........... H01L 23/5384; H01L 21/76802; H01L 21/76877; H01L 24/00; H01L 21/76898; H01L 23/481; H01L 23/5226; H01L 25/0657
See application file for complete search history.

(56) References Cited

U.S. PATENT DOCUMENTS

| 9,425,150 | B2 * | 8/2016 | Huang | ................ H01L 23/5386 |
| 9,449,914 | B2 * | 9/2016 | Ho | .......................... H01L 24/91 |
| 9,478,496 | B1 | 10/2016 | Lin | |

(Continued)

OTHER PUBLICATIONS

Office Action dated Apr. 28, 2022 related to U.S. Appl. No. 16/983,533 wherein this application is a DIV of U.S. Appl. No. 16/983,533.

(Continued)

*Primary Examiner* — Bac H Au
(74) *Attorney, Agent, or Firm* — Xuan Zhang

(57) ABSTRACT

A method of manufacturing a semiconductor structure includes steps of providing a first wafer including a first substrate, a first dielectric layer over the first substrate, and a first conductive pad surrounded by the first dielectric layer; providing a second wafer including a second substrate, a second dielectric layer over the second substrate, and a second conductive pad surrounded by the second dielectric layer; bonding the first dielectric layer with the second dielectric layer; forming a first opening extending through the second substrate and partially through the second dielectric layer; disposing a dielectric liner conformal to the first opening; forming a second opening extending through the second dielectric layer and the second conductive pad to at least partially expose the first conductive pad; and disposing a conductive material within the first opening and the second opening to form a conductive via over the first conductive pad.

13 Claims, 18 Drawing Sheets

(56) References Cited

U.S. PATENT DOCUMENTS

| | | | |
|---|---|---|---|
| 2007/0037379 A1* | 2/2007 | Enquist | H01L 24/94 |
| | | | 257/E21.597 |
| 2011/0133339 A1* | 6/2011 | Wang | H01L 25/50 |
| | | | 257/773 |
| 2013/0093098 A1* | 4/2013 | Yang | H01L 23/5226 |
| | | | 438/653 |
| 2014/0264709 A1* | 9/2014 | Tsai | H01L 23/5226 |
| | | | 438/26 |
| 2014/0264862 A1* | 9/2014 | Tsai | H01L 23/481 |
| | | | 257/774 |
| 2014/0327151 A1 | 11/2014 | Yang et al. | |
| 2015/0069619 A1* | 3/2015 | Chou | H01L 27/14636 |
| | | | 257/774 |
| 2015/0235949 A1* | 8/2015 | Yu | H01L 25/0652 |
| | | | 257/774 |
| 2015/0348905 A1 | 12/2015 | Tsai et al. | |
| 2017/0005000 A1* | 1/2017 | Beyne | H01L 21/76844 |
| 2017/0084489 A1 | 3/2017 | Lin et al. | |
| 2017/0271306 A1 | 9/2017 | Wang et al. | |
| 2018/0068984 A1 | 3/2018 | Beyne et al. | |

OTHER PUBLICATIONS

Office Action dated Jun. 17, 2022 related to Taiwanese Application No. 110119720.
Summary translation of Office Action dated Jun. 17, 2022 related to Taiwanese Application No. 110119720.
Office Action dated Jan. 11, 2022 related to U.S. Appl. No. 16/983,533 wherein this application is a DIV of U.S. Appl. No. 16/983,533.

* cited by examiner

METHOD FOR MANUFACTURING SEMICONDUCTOR STRUCTURE HAVING VIA THROUGH BONDED WAFERS

CROSS-REFERENCE TO RELATED APPLICATION

This application is a divisional application of U.S. Non-Provisional application Ser. No. 16/983,533 filed on Aug. 3, 2020, which is incorporated herein by reference in its entirety.

TECHNICAL FIELD

The present disclosure relates to a method of manufacturing a semiconductor structure, and the semiconductor structure. Particularly, the present disclosure relates to a method of manufacturing a semiconductor structure having a via extending through wafers bonded with each other.

DISCUSSION OF THE BACKGROUND

Semiconductor devices are used in a variety of electronic applications, such as personal computers, cellular telephones, digital cameras, and other electronic equipment. The fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve the integration density of the microelectronic components by continual reduction of minimum feature size, which allows more components to be integrated into a given area. Smaller package structures with smaller footprints are developed to package the semiconductor devices. For example, in an attempt to further increase density of the semiconductor device, stacking of two or more components has been investigated. However, such stacking may increase complexity of the manufacturing process. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a first wafer including a first substrate, a first dielectric layer over the first substrate, and a first conductive pad surrounded by the first dielectric layer; a second wafer including a second dielectric layer, a second substrate over the second dielectric layer, and a second conductive pad surrounded by the second dielectric layer; a bonding dielectric disposed between the first dielectric layer and the second dielectric layer to bond the first dielectric layer with the second dielectric layer; and a conductive via extending from the first conductive pad and surrounded by the bonding dielectric, the second conductive pad and the second wafer.

In some embodiments, the semiconductor structure further comprises a passivation disposed over the second substrate; and a dielectric liner between the conductive via and the second wafer and between the conductive via and the passivation.

In some embodiments, the dielectric liner is disposed above and in contact with the second dielectric layer.

In some embodiments, the conductive via includes a first portion surrounded by the bonding dielectric and the second conductive pad, and a second portion coupled with the first portion and surrounded by the second dielectric layer and the second substrate.

In some embodiments, a width of the first portion is substantially less than a width of the second portion.

In some embodiments, a thickness of the first substrate is substantially greater than a thickness of the second substrate.

In some embodiments, the bonding dielectric contacts the first conductive pad and the second conductive pad.

Another aspect of the present disclosure provides a method of manufacturing a semiconductor structure. The method includes steps of providing a first wafer including a first substrate, a first dielectric layer over the first substrate, and a first conductive pad surrounded by the first dielectric layer; providing a second wafer including a second substrate, a second dielectric layer over the second substrate, and a second conductive pad surrounded by the second dielectric layer; bonding the first dielectric layer with the second dielectric layer; forming a first opening extending through the second substrate and partially through the second dielectric layer; disposing a dielectric liner conformal to the first opening; forming a second opening extending through the second dielectric layer and the second conductive pad to at least partially expose the first conductive pad; and disposing a conductive material within the first opening and the second opening to form a conductive via over the first conductive pad.

In some embodiments, the conductive via extends through the second substrate, the second dielectric layer and the second conductive pad.

In some embodiments, the first dielectric layer is bonded with the second dielectric layer by a bonding dielectric.

In some embodiments, the second opening and the conductive via extend through the bonding dielectric.

In some embodiments, the second wafer is flipped prior to the bonding of the first dielectric layer with the second dielectric layer.

In some embodiments, the dielectric liner is disposed between the conductive via and the second substrate.

In some embodiments, the method further comprises disposing a passivation over the second substrate, wherein the first opening extends through the passivation.

In some embodiments, the dielectric liner is disposed between the conductive via and the passivation.

In some embodiments, the formation of the first opening includes disposing a patterned photoresist over the second wafer, and removing the second substrate and the second dielectric layer exposed through the patterned photoresist.

In some embodiments, the dielectric liner covers the patterned photoresist.

In some embodiments, the dielectric liner covering the patterned photoresist and a portion of the patterned photoresist are removed during the formation of the second opening.

In some embodiments, the patterned photoresist is removed after the formation of the second opening.

In some embodiments, the method further comprises reducing a thickness of the second substrate by grinding after the bonding of the first dielectric layer with the second dielectric layer.

In conclusion, because a semiconductor structure includes a via extending through wafers bonded with each other to electrically connect the wafers, an overall dimension of the semiconductor structure can be reduced. Furthermore, only one photomask for forming the via is necessary. Therefore, manufacturing cost and materials can be reduced or minimized.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
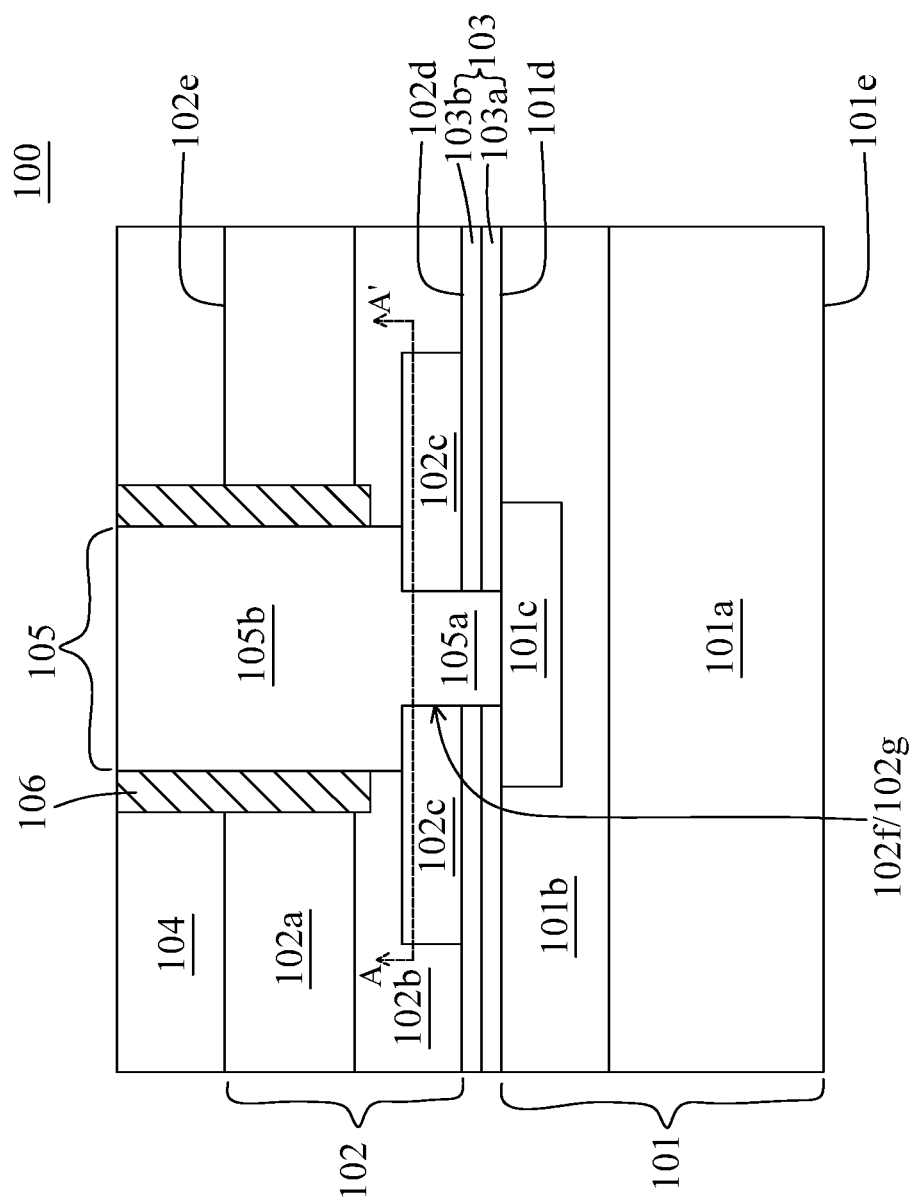
FIG. 1 is a cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor structure 100 in accordance with some embodiments of the present disclosure. In some embodiments, the semiconductor structure 100 is a part of a die, a package or a device. In some embodiments, the semiconductor structure 100 is a die, a package or a device. In some embodiments, the semiconductor structure 100 includes a first wafer 101, a second wafer 102, a bonding dielectric 103, a passivation 104, a conductive via 105 and a dielectric liner 106.

In some embodiments, the first wafer 101 is a workpiece that includes various features formed in or over the first wafer 101. In some embodiments, the first wafer 101 is in various stages of fabrication and is processed using various processes. In some embodiments, the first wafer 101 includes a variety of electrical circuits suitable for a particular application. In some embodiments, FIG. 1 illustrates a part of the first wafer 101. In some embodiments, a top cross section of the first wafer 101 has a circular shape or any other suitable shape.

In some embodiments, the first wafer 101 includes a first surface 101*d* and a second surface 101*e* opposite to the first surface 101*d*. In some embodiments, the first surface 101*d* is a front side of the first wafer 101, and the second surface 101*e* is a back side of the first wafer 101. In some embodiments, various features are formed in or over the first surface 101*d* of the first wafer 101.

In some embodiments, the first wafer 101 includes a first substrate 101*a*, a first dielectric layer 101*b* and a first conductive pad 101*c* formed in the first dielectric layer 101*b*. In some embodiments, the first substrate 101*a* is a part of the first wafer 101. In some embodiments, the first substrate 101*a* is a semiconductive layer. In some embodiments, the first substrate 101*a* includes semiconductive material such as silicon, germanium, gallium, arsenic, or a combination thereof. In some embodiments, the first substrate 101a is a silicon substrate.

In some embodiments, electrical devices or components (e.g., various N-type metal-oxide semiconductor (NMOS) and/or P-type metal-oxide semiconductor (PMOS) devices, capacitors, resistors, diodes, photodiodes, fuses, and/or the like) are subsequently formed in or over the first substrate 101a and configured to electrically connect to an external circuitry.

In some embodiments, the first dielectric layer 101b is disposed over the first substrate 101a. In some embodiments, the first dielectric layer 101b includes dielectric material such as oxide, nitride, silicon dioxide, silicon nitride, silicon oxynitride, silicon carbide, polymer or the like. In some embodiments, the first dielectric layer 101b includes several dielectric layers stacked over each other. In some embodiments, each of the dielectric layers includes materials that are same as or different from materials in the other.

In some embodiments, the first conductive pad 101c is disposed within the first dielectric layer 101b. In some embodiments, the first conductive pad 101c is surrounded by the first dielectric layer 101b. In some embodiments, the first conductive pad 101c is disposed adjacent to the first surface 101d of the first wafer 101 and at least partially exposed through the first dielectric layer 101b.

In some embodiments, the first conductive pad 101c laterally extends in the first dielectric layer 101b. In some embodiments, the first conductive pad 101c is configured to electrically connect to a die, a package or a circuitry external to the semiconductor structure 100. In some embodiments, the first conductive pad 101c includes conductive material such as gold, silver, copper, nickel, tungsten, aluminum, tin, alloys thereof or the like. In some embodiments, a top cross section of the first conductive pad 101c has a circular or polygonal shape.

In some embodiments, the second wafer 102 is disposed over the first wafer 101. In some embodiments, the second wafer 102 has a configuration similar to that of the first wafer 101. In some embodiments, a thickness of the first wafer 101 is substantially greater than a thickness of the second wafer 102.

In some embodiments, the second wafer 102 includes a third surface 102d and a fourth surface 102e opposite to the third surface 102d. In some embodiments, the third surface 102d is a front side of the second wafer 102, and the fourth surface 102e is a back side of the second wafer 102. In some embodiments, various features are formed in or over the third surface 102d of the second wafer 102. In some embodiments, the first surface 101d is proximal to the third surface 102d and distal to the fourth surface 102e.

In some embodiments, the second wafer 102 includes a second substrate 102a, a second dielectric layer 102b and a second conductive pad 102c formed in the second dielectric layer 102b. In some embodiments, the second substrate 102a is a part of the second wafer 102. In some embodiments, the second substrate 102a has a configuration similar to that of the first substrate 101a. In some embodiments, a thickness of the first substrate 101a is substantially greater than a thickness of the second substrate 102a. In some embodiments, the thickness of the second substrate 102a is in a range of about 20 μm to about 50 μm. In some embodiments, the thickness of the second substrate 102a is about 30 μm.

In some embodiments, the second substrate 102a is disposed over the second dielectric layer 102b. In some embodiments, the second dielectric layer 102b has a configuration similar to that of the first dielectric layer 101b. In some embodiments, the second dielectric layer 102b is disposed over and proximal to the first dielectric layer 101b. In some embodiments, the second dielectric layer 102b includes a material that is same as or different from materials in the first dielectric layer 101b. In some embodiments, a thickness of the second dielectric layer 102b is substantially equal to, greater than or less than a thickness of the first dielectric layer 101b.

In some embodiments, the second conductive pad 102c is disposed within the second dielectric layer 102b. In some embodiments, the second conductive pad 102c is surrounded by the second dielectric layer 102b. In some embodiments, the second conductive pad 102c is disposed adjacent to the third surface 102d of the second wafer 102 and at least partially exposed through the second dielectric layer 102b.

In some embodiments, the second conductive pad 102c laterally extends in the second dielectric layer 102b. In some embodiments, the second conductive pad 102c has a configuration similar to that of the first conductive pad 101c. In some embodiments, the second conductive pad 102c includes a material that is same as or different from materials in the first conductive pad 101c.

Figure 2:
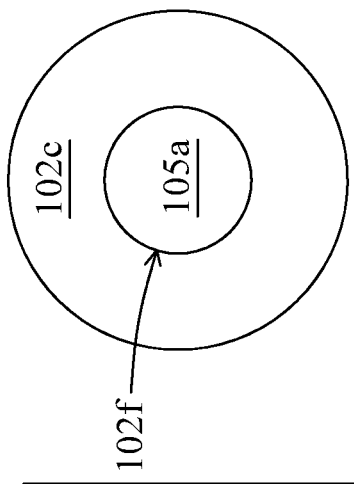
FIG. 2 is a cross-sectional view of a portion of the semiconductor structure along a line A-A' of FIG. 1 in accordance with some embodiments of the present disclosure.
Figure 3:
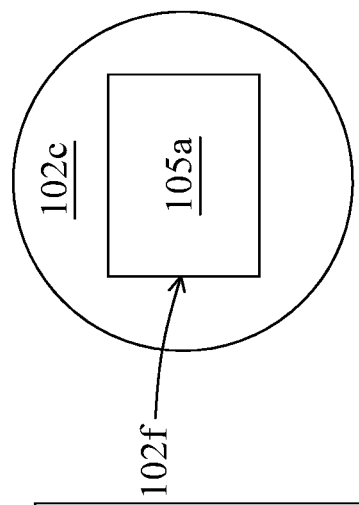
FIG. 3 is another cross-sectional view of the portion of the semiconductor structure along a line A-A' of FIG. 1 in accordance with some embodiments of the present disclosure.
Figure 4:
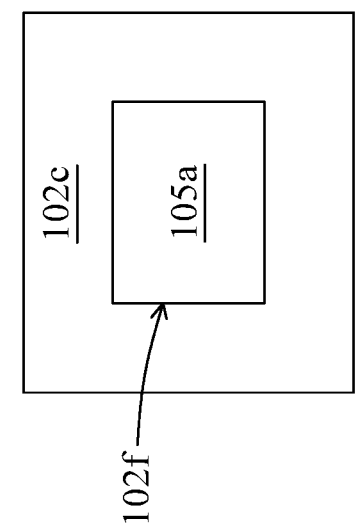
FIG. 4 is another cross-sectional view of the portion of the semiconductor structure along a line A-A' of FIG. 1 in accordance with some embodiments of the present disclosure.
Figure 5:
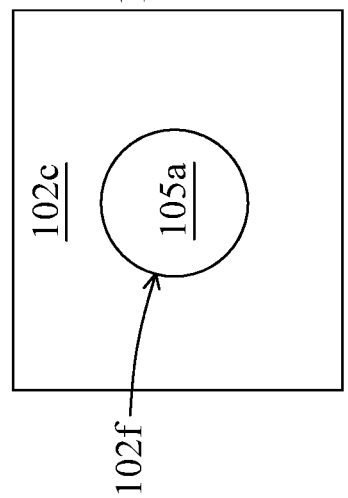
FIG. 5 is another cross-sectional view of the portion of the semiconductor structure along a line A-A' of FIG. 1 in accordance with some embodiments of the present disclosure.

In some embodiments, the second conductive pad 102c is in a single piece. In some embodiments, a top cross section (along a line A-A' in FIG. 1) of the second conductive pad 102c has a ring or frame shape as shown in FIGS. 2 to 5. In some embodiments, an outer perimeter of the top cross section of the second conductive 102c has a rectangular shape as shown in FIGS. 2 and 4, a circular shape as shown in FIGS. 3 and 5, or a polygonal shape.

In some embodiments, the second conductive pad 102c includes an opening 102f. In some embodiments, a perimeter of the top cross section of the opening 102f has a rectangular shape as shown in FIGS. 2 and 5, a circular shape as shown in FIGS. 3 and 4, or a polygonal shape. In some embodiments, a width of the opening 102f is in a range of about 2 μm to about 10 μm.

Figure 6:
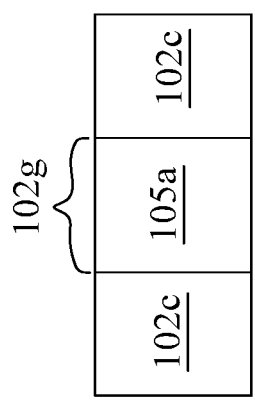
FIG. 6 is another cross-sectional view of the portion of the semiconductor structure along a line A-A' of FIG. 1 in accordance with some embodiments of the present disclosure.

In some embodiments, the top cross section (along a line A-A' in FIG. 1) of the second conductive pad 102c has a rectangular shape as shown in FIG. 6 or a polygonal shape. In some embodiments, the second conductive pad 102c includes more than one piece. In some embodiments, the second conductive pad 102c comprises two pieces separated from each other. In some embodiments, there is a gap 102g between the two pieces of the second conductive pad 102c. In some embodiments, a width of the gap 102g is in a range of about 2 μm to about 10 μm.

Referring back to FIG. 1, the second conductive pad 102c is disposed over the first conductive pad 101c. In some embodiments, the second conductive pad 102c at least partially overlaps the first conductive pad 101c. In some embodiments, the opening 102f or the gap 102g is disposed above the first conductive pad 101c. In some embodiments, the opening 102f or the gap 102g is disposed adjacent to the third surface 102d of the second wafer 102.

In some embodiments, the second wafer 102 is bonded over the first wafer 101 by the bonding dielectric 103. In some embodiments, the bonding dielectric 103 is disposed between the first dielectric layer 101b and the second dielectric layer 102b to bond the first dielectric layer 101b with the second dielectric layer 102b. In some embodiments, the bonding dielectric 103 is disposed between the first surface 101d and the third surface 102d.

In some embodiments, the bonding dielectric 103 is in contact with the first conductive pad 101c and the second conductive pad 102c. In some embodiments, the bonding dielectric 103 includes polymer, benzocyclobutene (BCB), polybenzoxazole (PBO), polyimide (PI) or the like. In some embodiments, the bonding dielectric 103 includes oxide, nitride or the like. In some embodiments, an interface within the bonding dielectric 103 is absent.

In some embodiments, the bonding dielectric 103 includes several bonding dielectric layers. In some embodiments, the bonding dielectric 103 includes a first bonding dielectric layer 103a and a second bonding dielectric layer 103b. In some embodiments, the second bonding dielectric layer 103b is disposed over the first bonding dielectric layer 103a. In some embodiments, the second bonding dielectric layer 103b includes a material that is same as or different from materials in the first bonding dielectric layer 103a.

In some embodiments, the first conductive pad 101c is at least partially in contact with the first bonding dielectric layer 103a. In some embodiments, the second conductive pad 102c is at least partially in contact with the second bonding dielectric layer 103b.

In some embodiments, a thickness of the first bonding dielectric layer 103a is substantially less than 10 μm. In some embodiments, the thickness of the first bonding dielectric layer 103a is substantially less than 5 μm. In some embodiments, a thickness of the second bonding dielectric layer 103b is substantially less than 10 μm. In some embodiments, the thickness of the second bonding dielectric layer 103b is substantially less than 5 μm.

In some embodiments, an interface is present within the bonding dielectric 103 and between the first bonding dielectric layer 103a and the second bonding dielectric layer 103b.

In some embodiments, the semiconductor structure 100 further includes a passivation 104 over the second wafer 102. In some embodiments, the passivation 104 is disposed over the fourth surface 102e of the second wafer 102. In some embodiments, the passivation 104 is disposed over the second substrate 102a. In some embodiments, the passivation 104 includes dielectric materials, such as spin-on glass (SOG), silicon oxide, silicon oxynitride, silicon nitride or the like. In some embodiments, the passivation 104 includes polymer, BCB, PBO, PI or the like.

In some embodiments, the conductive via 105 extends from and is electrically connected to the first conductive pad 101c. In some embodiments, the conductive via 105 is surrounded by the bonding dielectric 103, the second conductive pad 102c and the second wafer 102. In some embodiments, the conductive via 105 extends through the bonding dielectric 103, the second conductive pad 102c, the second dielectric layer 102b, the second substrate 102a and the passivation 104.

In some embodiments, the conductive via 105 couples to the first conductive pad 101c. In some embodiments, the conductive via 105 is substantially orthogonal to the first conductive pad 101c. In some embodiments, the conductive via 105 is a through substrate via (TSV). In some embodiments, the conductive via 105 includes conductive material such as gold, silver, copper, nickel, tungsten, aluminum, tin, alloys thereof or the like. In some embodiments, a top cross section of the conductive via 105 has a circular or polygonal shape. In some embodiments, the conductive via 105 has a cylindrical shape.

In some embodiments, the conductive via 105 includes a first portion 105a surrounded by the bonding dielectric 103 and the second conductive pad 102c, and a second portion 105b coupled with the first portion 105a and surrounded by the second dielectric layer 102b and the second substrate 102a. In some embodiments, the second portion 105b is disposed over the first portion 105a.

In some embodiments, a width of the first portion 105a is substantially less than a width of the second portion 105b. In some embodiments, the width of the second portion 105b is substantially equal to the width of the opening 102f or the gap 102g. In some embodiments, the width of the first portion 105a is in a range of about 2 μm to about 10 μm. In some embodiments, the width of the second portion 105b is in a range of about 4 μm to about 10 μm. In some embodiments, the width of the second portion 105b is about 7 μm.

In some embodiments, the conductive via 105 has a step between the first portion 105a and the second portion 105b. In some embodiments, the second portion 105b is at least partially in contact with the second conductive pad 102c. In some embodiments, the first portion 105a is disposed within the opening 102f as shown in FIGS. 2 to 5 or the gap 102g as shown in FIG. 6.

In some embodiments, the semiconductor structure 100 further includes a dielectric liner 106 between the conductive via 105 and the second wafer 102. In some embodiments, the dielectric liner 106 is disposed between the conductive via 105 and the second substrate 102a, and between the conductive via 105 and the second dielectric layer 102b. In some embodiments, the dielectric liner 106 is disposed between the conductive via 105 and the passivation 104. In some embodiments, a top surface of the dielectric liner 106 is substantially coplanar with a top surface of the passivation 104 and a top surface of the second portion 105b of the conductive via 105.

In some embodiments, the dielectric liner 106 is disposed between the second portion 105b and the passivation 104, and between the second portion 105b and the second substrate 102a. In some embodiments, the dielectric liner 106 extends vertically along a sidewall of the second portion 105b, through the passivation 104 and the second substrate 102a, and partially through the second dielectric layer 102b. In some embodiments, the dielectric liner 106 is disposed above and in contact with the second dielectric layer 102b. In some embodiments, the dielectric liner 106 includes dielectric material such as oxide or the like.

Figure 7:
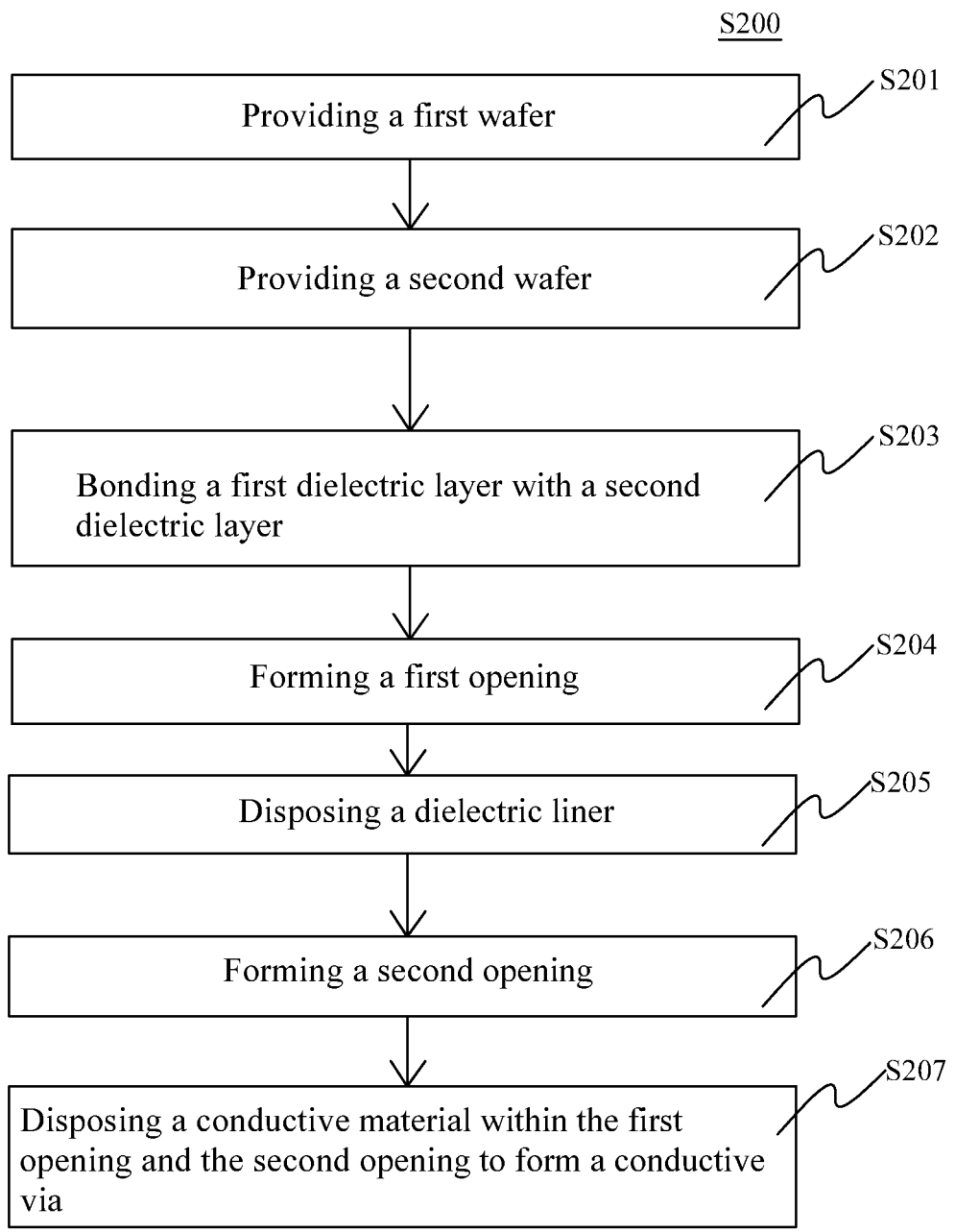
FIG. 7 is a flow diagram illustrating a method of manufacturing a semiconductor structure in accordance with some embodiments of the present disclosure.

FIG. 7 is a flow diagram illustrating a method S200 of manufacturing the semiconductor structure 100 in accordance with some embodiments of the present disclosure, and FIGS. 8 through 21 illustrate cross-sectional views of intermediate stages in the formation of the semiconductor structure 100 in accordance with some embodiments of the present disclosure.

The stages shown in FIGS. 8 to 21 are also illustrated schematically in the flow diagram in FIG. 7. In the following discussion, the fabrication stages shown in FIGS. 8 to 21 are discussed in reference to the process steps shown in FIG. 7. The method S200 includes a number of operations and the description and illustration are not deemed as a limitation as the sequence of the operations. The method S200 includes a number of steps (S201, S202, S203, S204, S205, S206 and S207).

Figure 8:
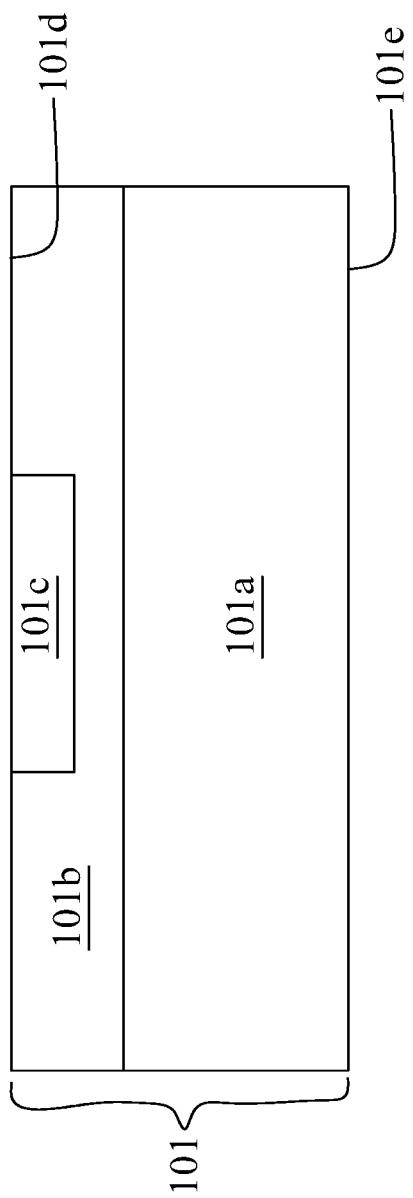
FIGS. 8 through 21 illustrate cross-sectional views of intermediate stages in the formation of a semiconductor structure in accordance with some embodiments of the present disclosure.

Referring to FIG. 8, a first wafer 101 is provided according to a step S201. In some embodiments, the first wafer 101 has a first surface 101d and a second surface 101e opposite to the first surface 101d. In some embodiments, the first wafer 101 includes a first substrate 101a, a first dielectric layer 101b disposed over the first substrate 101a, and a first conductive pad 101c surrounded by the first dielectric layer 101b. In some embodiments, the first dielectric layer 101b is formed on the first substrate 101a by deposition, chemical vapor deposition (CVD) or another suitable operation.

In some embodiments, the first conductive pad 101c is formed by removing a portion of the first dielectric layer 101b to form a recess and disposing a conductive material to fill the recess to form the first conductive pad 101c. In some embodiments, the conductive material is disposed by electroplating, sputtering or another suitable operation. In some embodiments, the first conductive pad 101c is at least partially exposed through the first dielectric layer 101b. In some embodiments, the first wafer 101, the first substrate 101a, the first dielectric layer 101b and the first conductive pad 101c have configurations similar to those described above or illustrated in FIG. 1.

Figure 9:
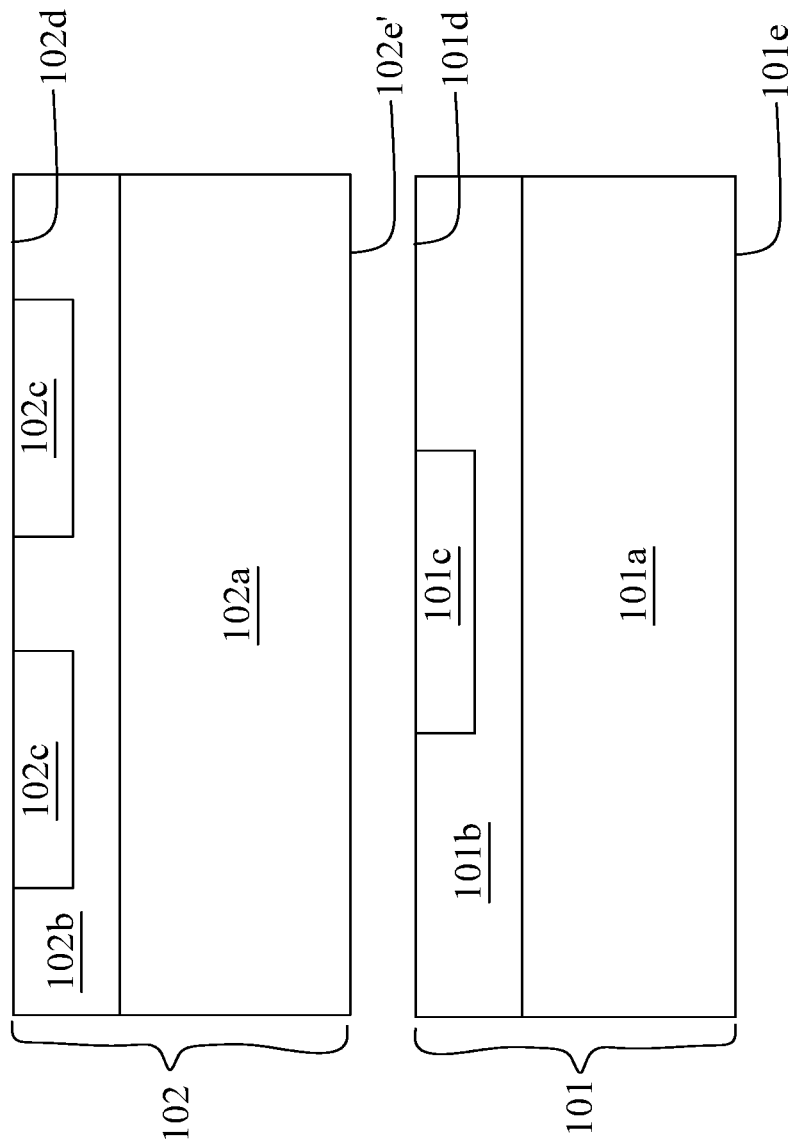

Referring to FIG. 9, a second wafer 102 is provided according to a step S202. In some embodiments, the second wafer 102 includes a third surface 102d and a pre-treated fourth surface 102e' opposite to the third surface 102d. In some embodiments, the second wafer 102 includes a second substrate 102a, a second dielectric layer 102b over the second substrate 102a, and a second conductive pad 102c surrounded by the second dielectric layer 102b. In some embodiments, the second dielectric layer 102b is formed on the second substrate 102a by deposition, CVD or another suitable operation.

In some embodiments, the second conductive pad 102c is formed by removing a portion of the second dielectric layer 102b to form a recess and disposing a conductive material to fill the recess to form the second conductive pad 102c. In some embodiments, the conductive material is disposed by electroplating, sputtering or another suitable operation. In some embodiments, the second conductive pad 102c is at least partially exposed through the second dielectric layer 102b. In some embodiments, the second wafer 102, the second substrate 102a, the second dielectric layer 102b and the second conductive pad 102c have configurations similar to those described above or illustrated in FIG. 1.

Figure 10:
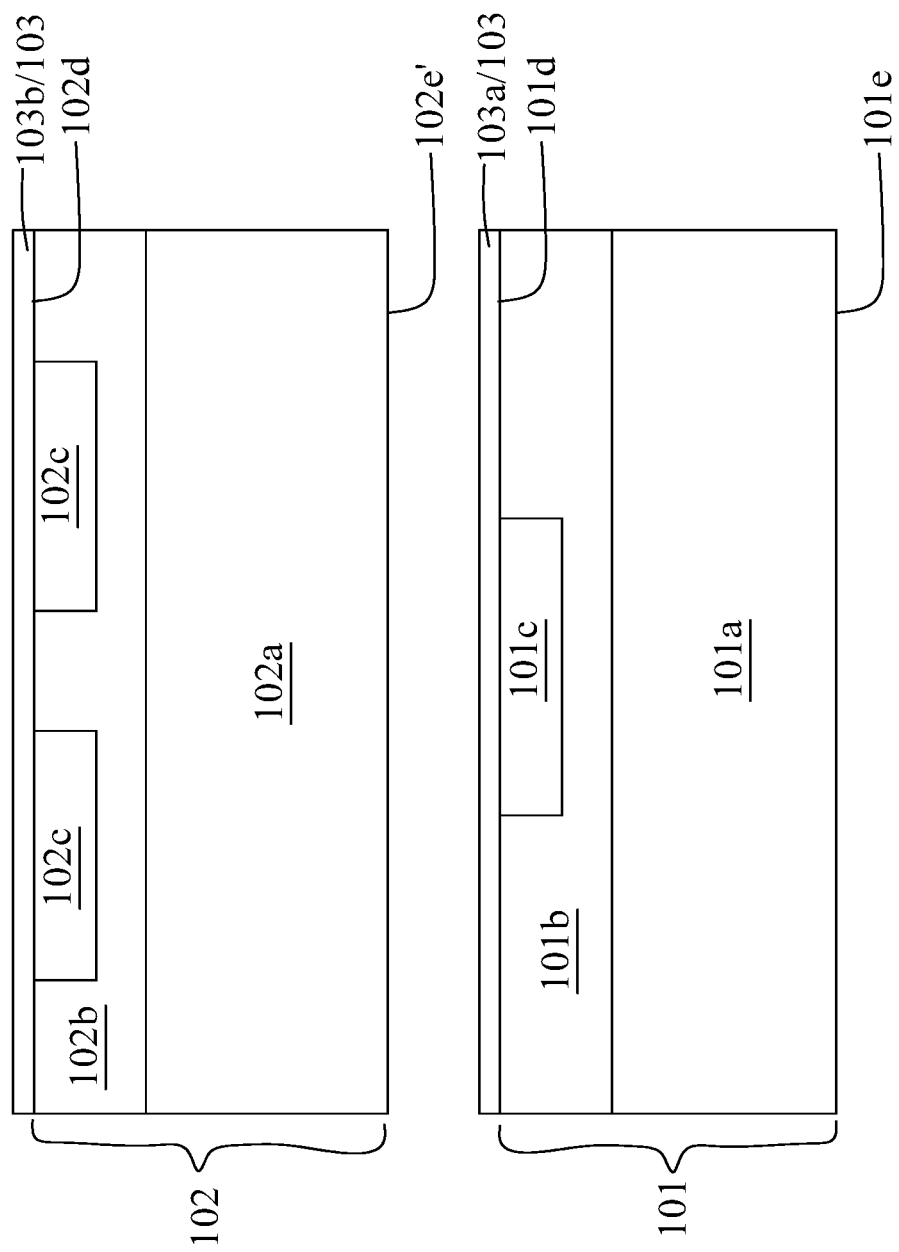

In some embodiments, a bonding dielectric 103 is disposed over the first wafer 101 or the second wafer 102 as shown in FIG. 10. In some embodiments, the bonding dielectric 103 is disposed over the first surface 101d or the third surface 102d. In some embodiments, a first bonding dielectric layer 103a is disposed over the first wafer 101, and a second bonding dielectric layer 103b is disposed over the second wafer 102.

In some embodiments, the first bonding dielectric layer 103a is disposed over the first surface 101d, and the second bonding dielectric layer 103b is disposed over the third surface 102d. In some embodiments, the disposing of the first bonding dielectric layer 103a and the disposing of the second bonding dielectric layer 103b are performed separately or simultaneously. In some embodiments, the bonding dielectric 103 has a configuration similar to that described above or illustrated in FIG. 1.

Figure 11:
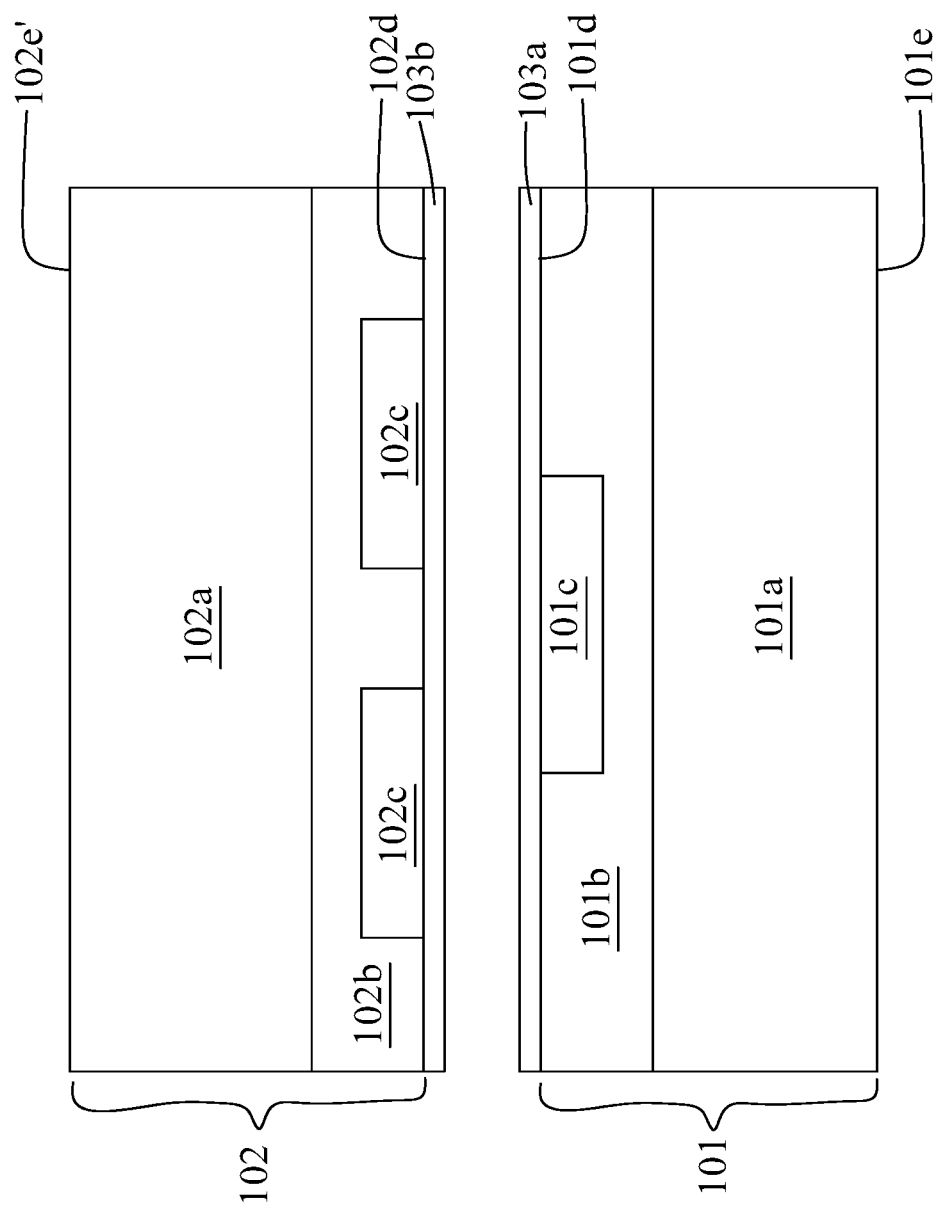

In some embodiments, after the disposing of the bonding dielectric 103 on the first wafer 101 or the second wafer 102, the second wafer 102 is flipped as shown in FIG. 11, such that the first dielectric layer 101b and the second dielectric layer 102b are disposed adjacent to and opposite to each other. In some embodiments, the first surface 101d faces the third surface 102d.

Figure 12:
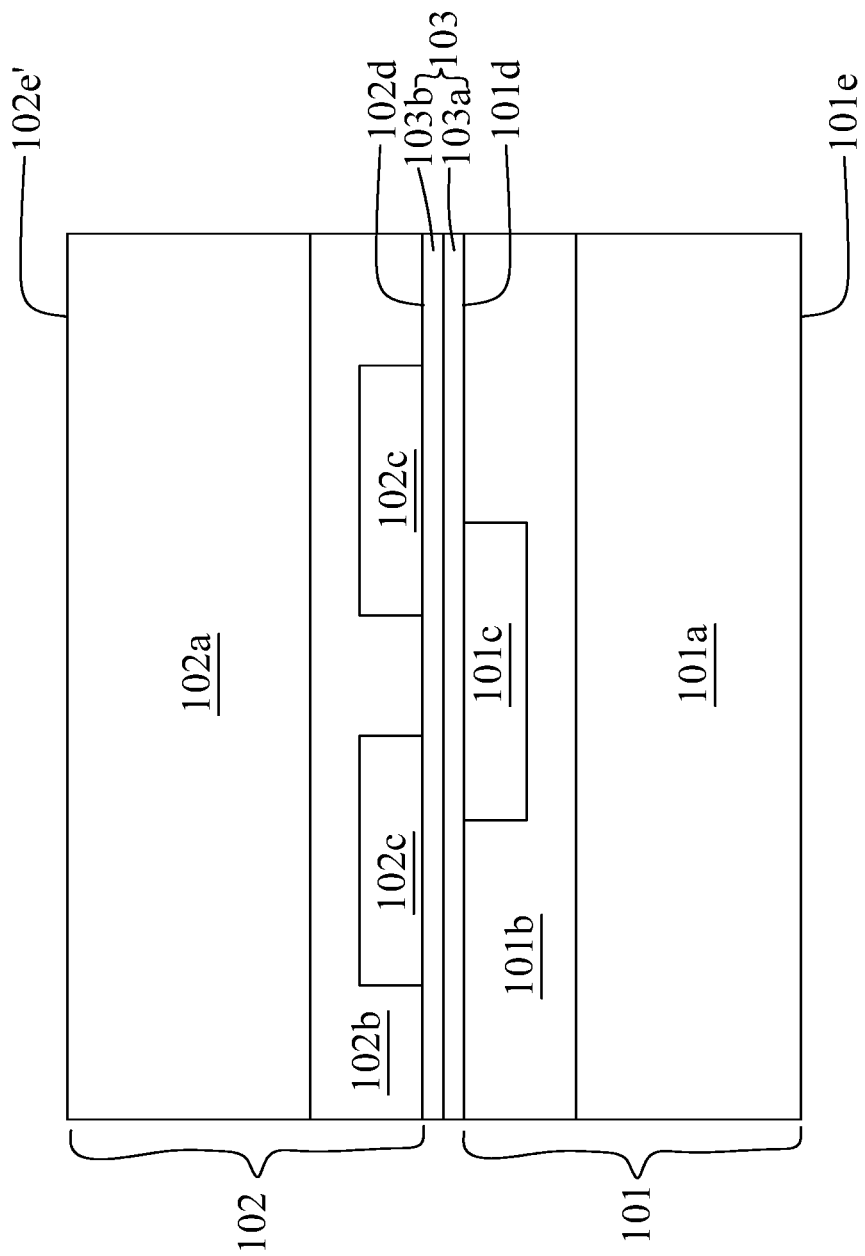

Referring to FIG. 12, the first dielectric layer 101b is bonded with the second dielectric layer 101c according to a step S203. In some embodiments, the second wafer 102 is bonded over the first wafer 101. In some embodiments, the second wafer 102 is flipped prior to the bonding of the first dielectric layer 101b with the second dielectric layer 102b (step S202). In some embodiments, the first dielectric layer 101b is bonded with the second dielectric layer 101c by the bonding dielectric 103. In some embodiments, the first wafer 101 and the second wafer 102 are bonded by oxide-to-oxide bonding technique or another suitable operation.

Figure 13:
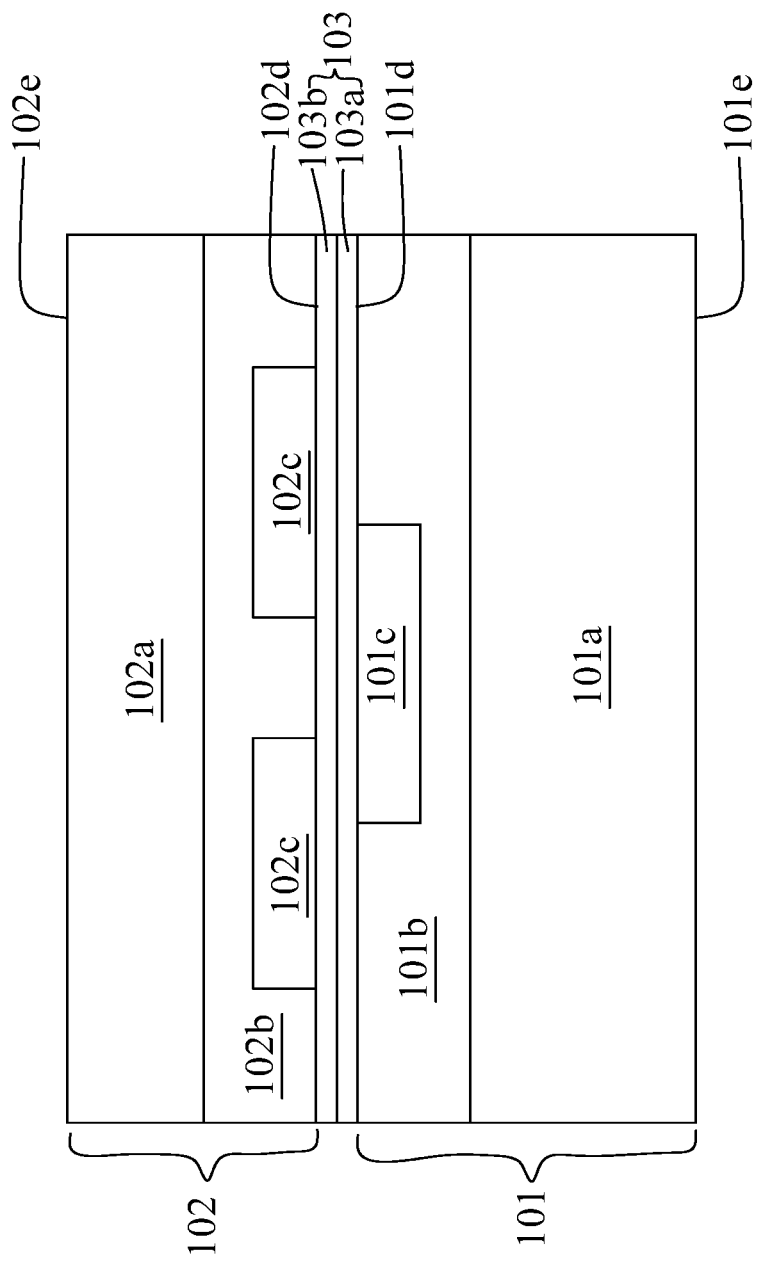

In some embodiments, after the bonding of the first wafer 101 with the second wafer 102, the second substrate 102a is ground as shown in FIG. 13. In some embodiments, a thickness of the second substrate 102a is reduced by grinding, etching, chemical mechanical planarization (CMP) or another suitable operation. In some embodiments, the second substrate 102a is planarized, and the pre-treated fourth surface 102e' becomes a fourth surface 102e after the reduction of the thickness of the second substrate 102a. In some embodiments, the thickness of the second substrate 102a is substantially less than a thickness of the first substrate 101a.

Figure 14:
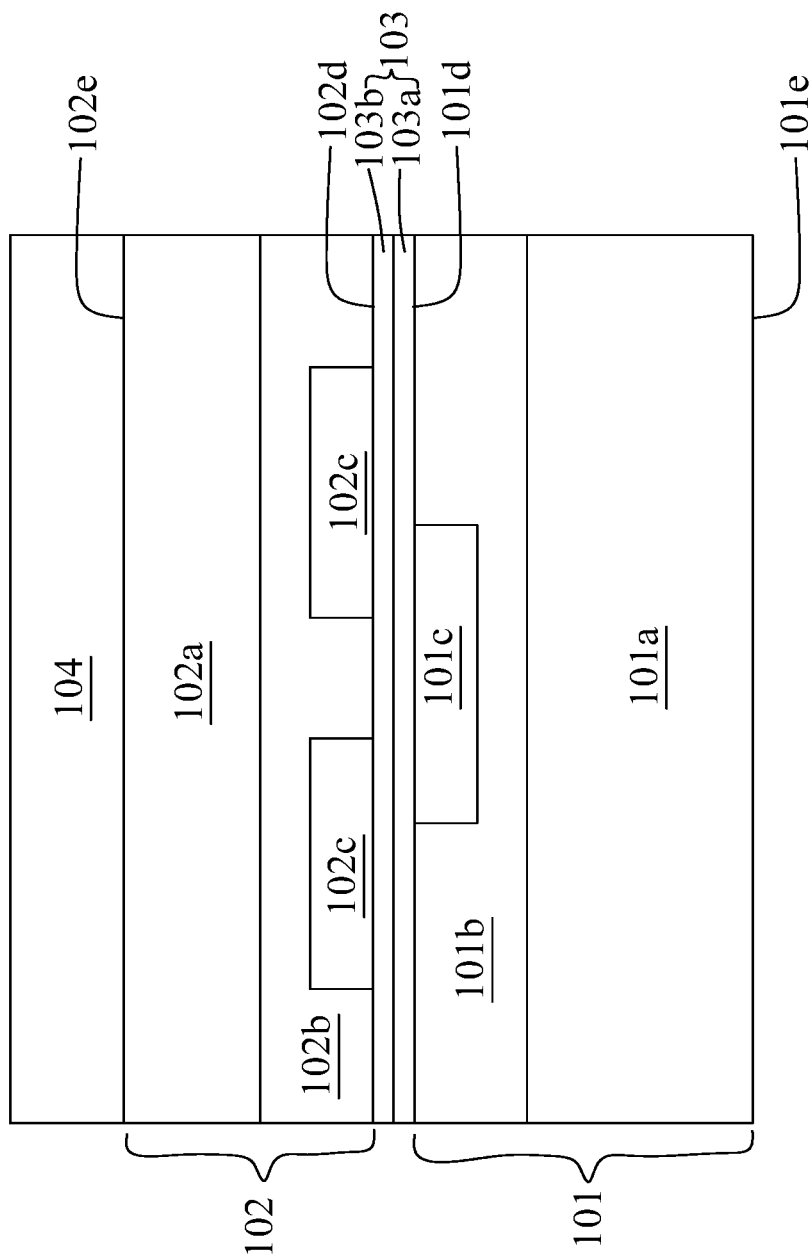

In some embodiments, after the reduction of the thickness of the second substrate 102e, a passivation 104 is disposed over the second wafer 102 as shown in FIG. 14. In some embodiments, the passivation 104 is formed over the second substrate 102a. In some embodiments, the passivation 104 is formed by deposition, CVD or another suitable operation. In some embodiments, the passivation 104 has a configuration similar to that described above or illustrated in FIG. 1.

Figure 15:
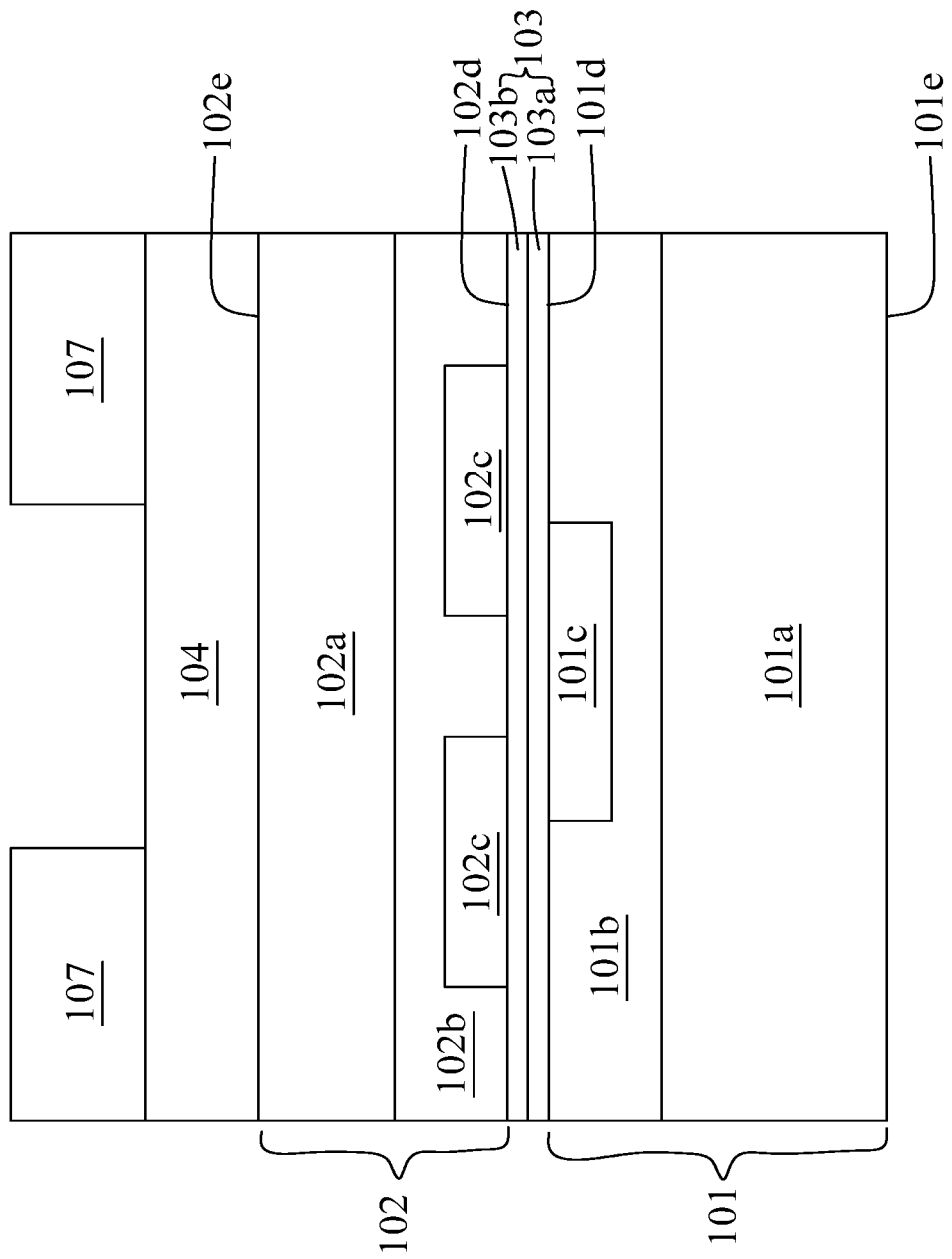

In some embodiments, after the disposing of the passivation 104, a patterned photoresist 107 is disposed over the second wafer 102 as shown in FIG. 15. In some embodiments, the patterned photoresist 107 is formed by disposing a photoresist material over the passivation 104 and removing a portion of the photoresist material. In some embodiments, the removed portion of the patterned photoresist 107 has a width in a range of about 4 µm to 10 µm. In some embodiments, the width is about 7 µm.

In some embodiments, the photoresist material is disposed by spin coating or another suitable operation. In some embodiments, the patterned photoresist 107 is formed by performing an exposure process and a develop process on the photoresist material. In some embodiments, at least a portion of the passivation 104 is exposed through the patterned photoresist 107.

Figure 16:
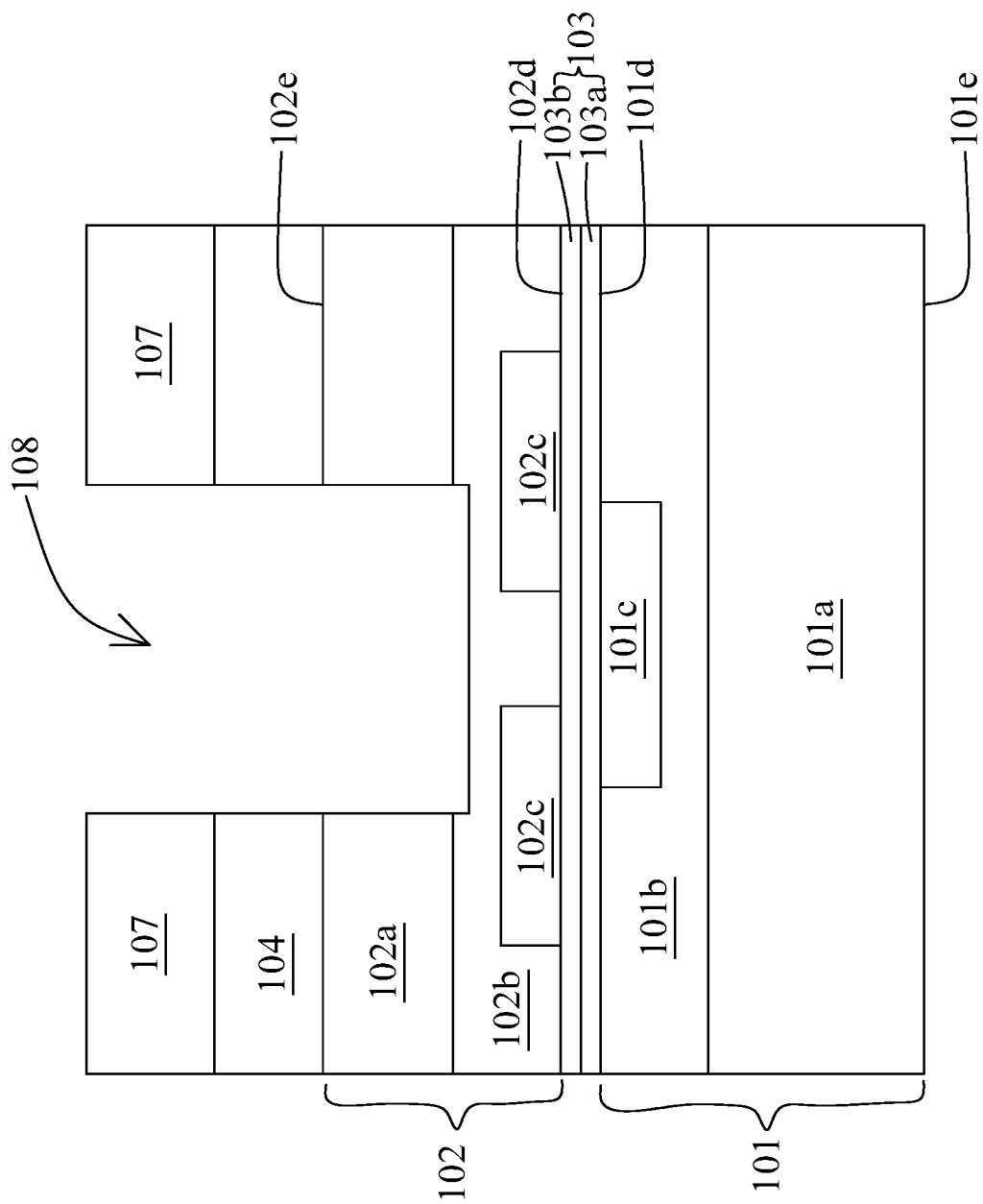

Referring to FIG. 16, a first opening 108 is formed according to a step S204. In some embodiments, the first opening 108 is formed by photolithography, etching or another suitable operation. In some embodiments, the first opening 108 extends through the second substrate 102a and partially through the second dielectric layer 102b. In some embodiments, the first opening 108 also extends through the passivation 104.

In some embodiments, the first opening 108 is formed by removing a portion of the second substrate 102a, a portion of the second dielectric layer 102b and a portion of the passivation 104 exposed through the patterned photoresist 107. In some embodiments, the first opening 108 has a width in a range of about 4 µm to 10 µm. In some embodiments, the width is about 7 µm. In some embodiments, the second conductive pad 102c is not exposed by the first opening 108. The second conductive pad 102c is still covered by the second dielectric layer 102b.

Figure 17:
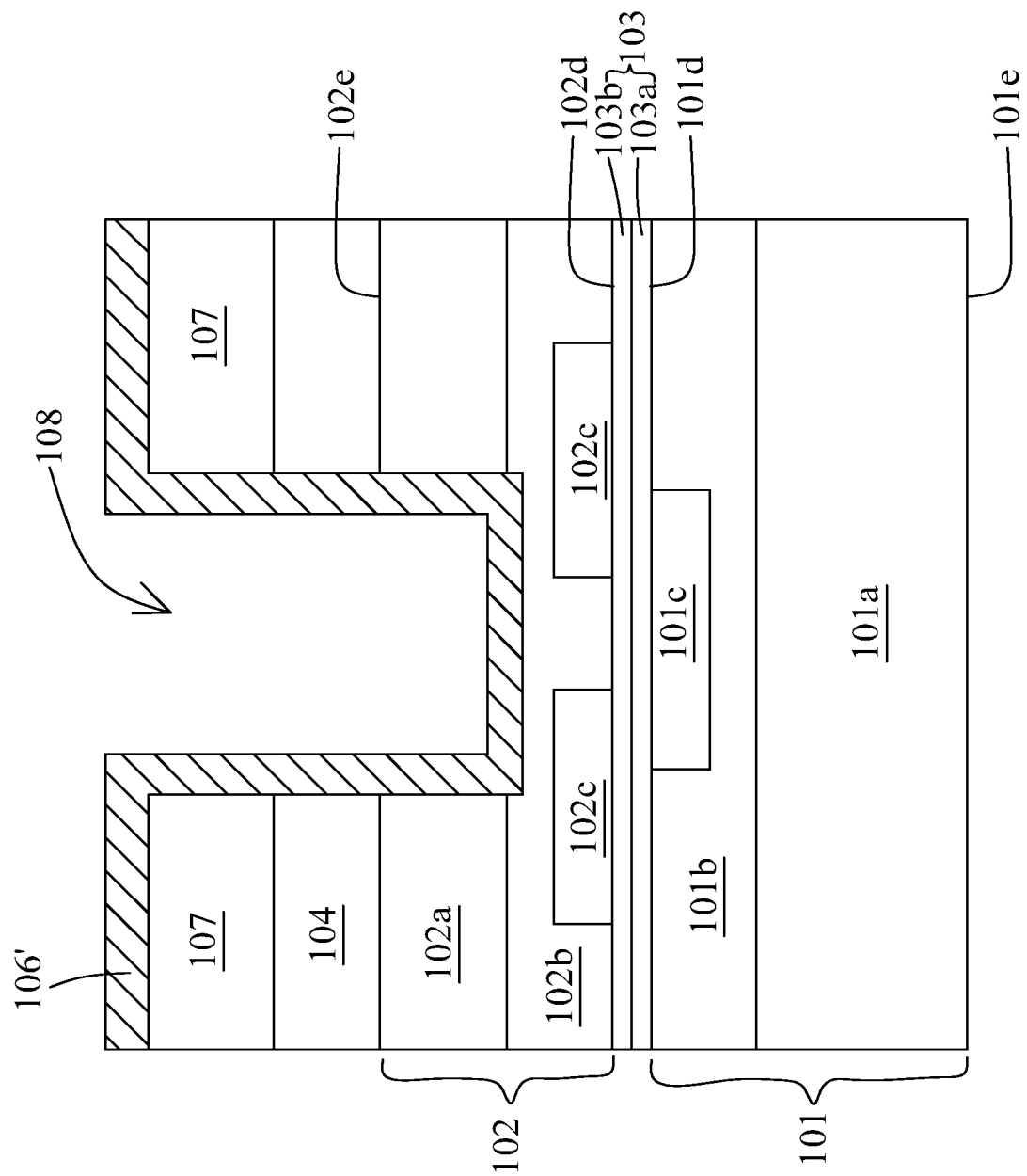

Referring to FIG. 17, a pre-treated dielectric liner 106' is disposed conformal to the first opening 108 according to a step S205. In some embodiments, the pre-treated dielectric liner 106' also covers the patterned photoresist 107. In some embodiments, the pre-treated dielectric liner 106' is disposed along a sidewall and a bottom wall of the first opening 108. In some embodiments, the pre-treated dielectric liner 106' is configured to protect the second substrate 102a and the passivation 104 from subsequent etching.

In some embodiments, the pre-treated dielectric liner 106' is disposed by deposition, atomic layer deposition (ALD), CVD or another suitable operation. In some embodiments, the pre-treated dielectric liner 106' includes dielectric material such as oxide or the like. In some embodiments, a thickness of the pre-treated dielectric liner 106' is in a range of about 1000 Å to 5000 Å. In some embodiments, the thickness of the pre-treated dielectric liner 106' is about 3000 Å.

Figure 18:
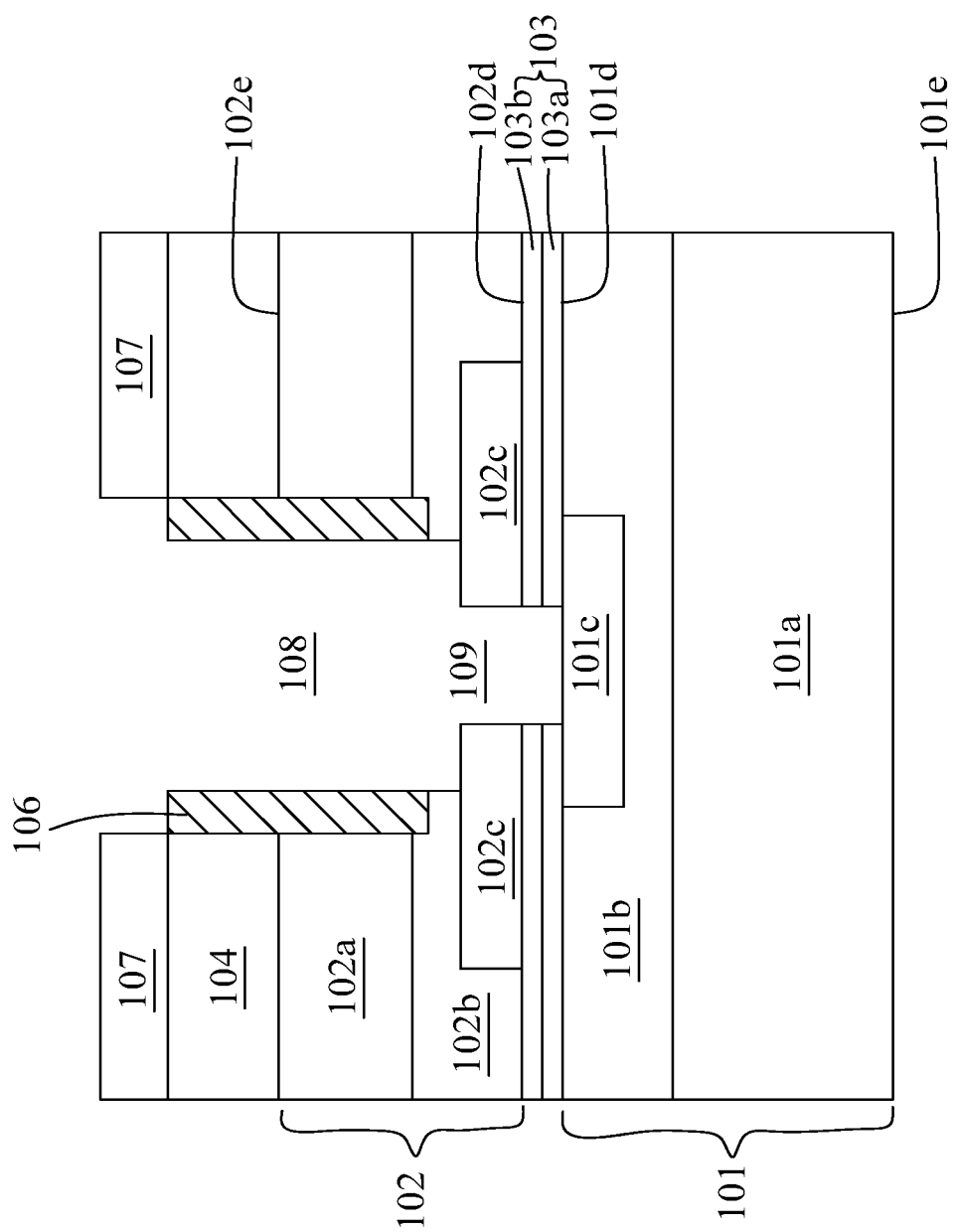

Referring to FIG. 18, a second opening 109 is formed according to a step S206. In some embodiments, the second opening 109 extends through the second dielectric layer 102*b* and the second conductive pad 102*c* to at least partially expose the first conductive pad 101*c*. In some embodiments, the first opening 108 is disposed above and coupled with the second opening 109. In some embodiments, the second opening 109 is formed by photolithography, etching or another suitable operation.

In some embodiments, the second opening 109 is formed by removing a portion of the pre-treated dielectric liner 106' on the second dielectric layer 102*b* and along the bottom wall of the first opening 108, and then removing a portion the second dielectric layer 102*b* exposed through the first opening 108. In some embodiments, a portion of the pre-treated dielectric liner 106' on the patterned photoresist 107 is also removed, so as to form a dielectric liner 106.

In some embodiments, a portion of the patterned photoresist 107 is also removed during the formation of the second opening 109. In some embodiments, a thickness of the patterned photoresist 107 is reduced after the formation of the second opening 109. In some embodiments, the dielectric liner 106 has a top surface substantially coplanar with a top surface of the passivation 104. In some embodiments, the top surface of the dielectric liner 106 is substantially lower than a top surface of the patterned photoresist 107.

In some embodiments, the dielectric liner 106 has a configuration similar to that described above or illustrated in FIG. 1.

Figure 19:
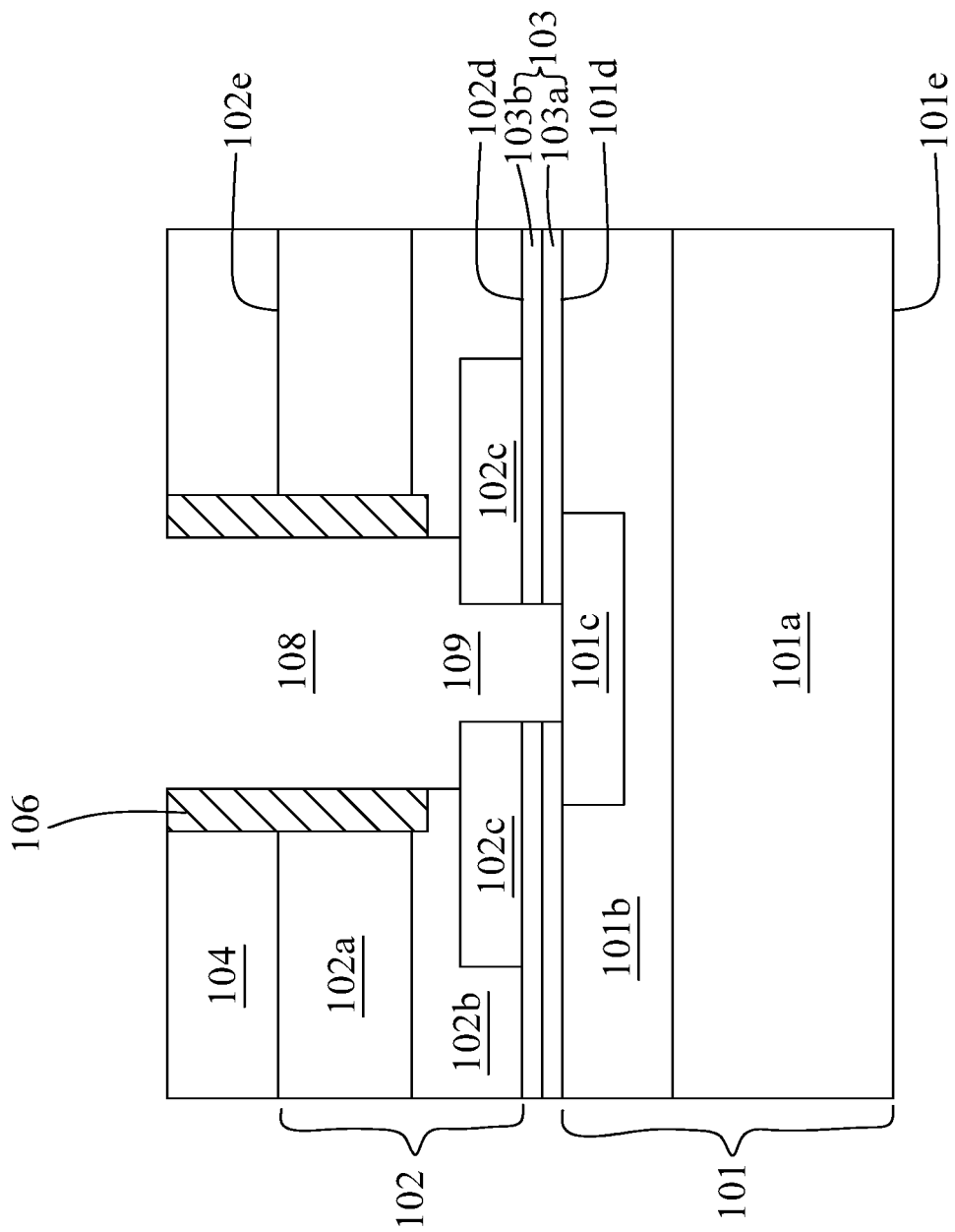

In some embodiments, the patterned photoresist 107 is removed after the formation of the second opening 109 as shown in FIG. 19. In some embodiments, the patterned photoresist 107 is removed by stripping, etching or another suitable operation.

Figure 20:
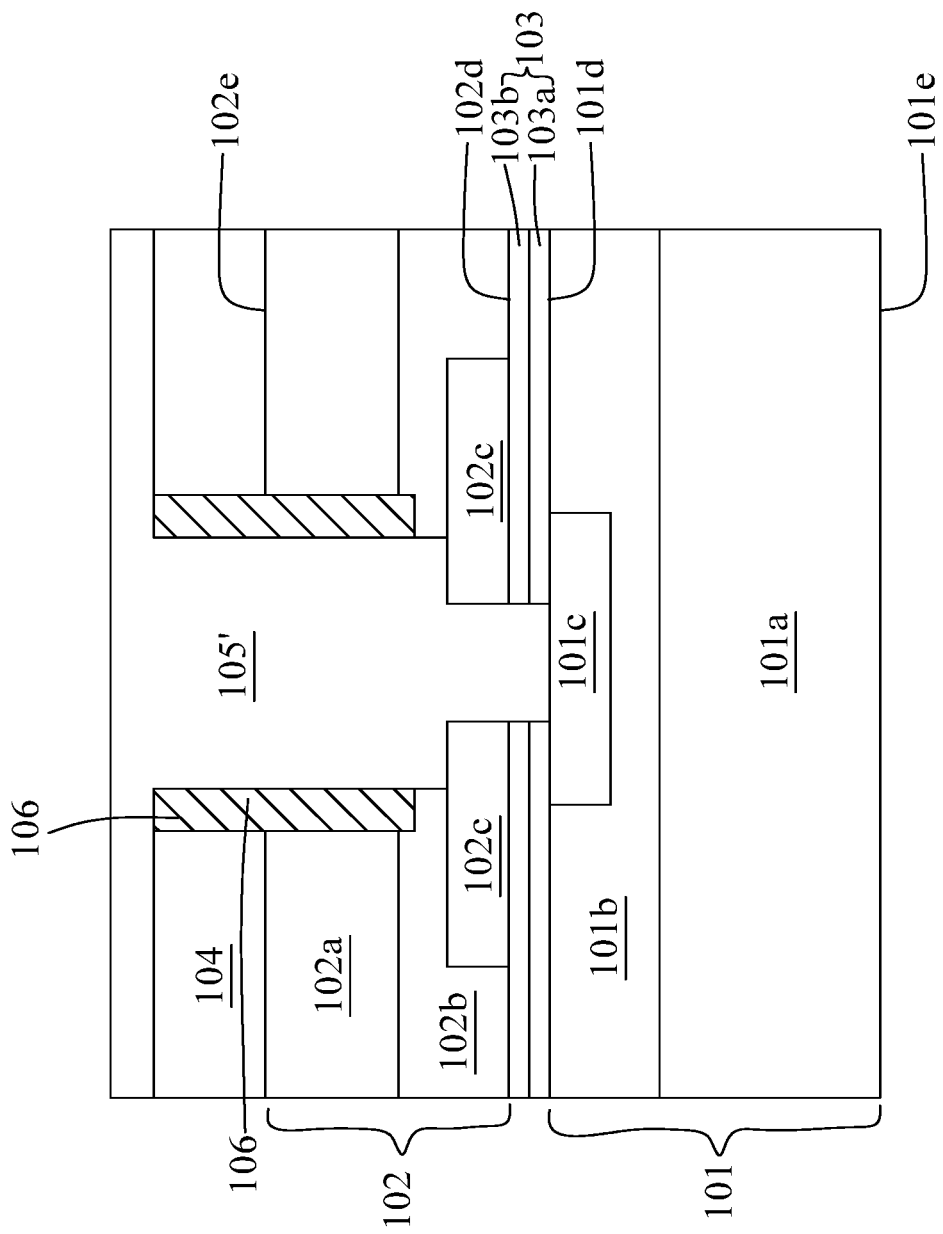
Figure 21:
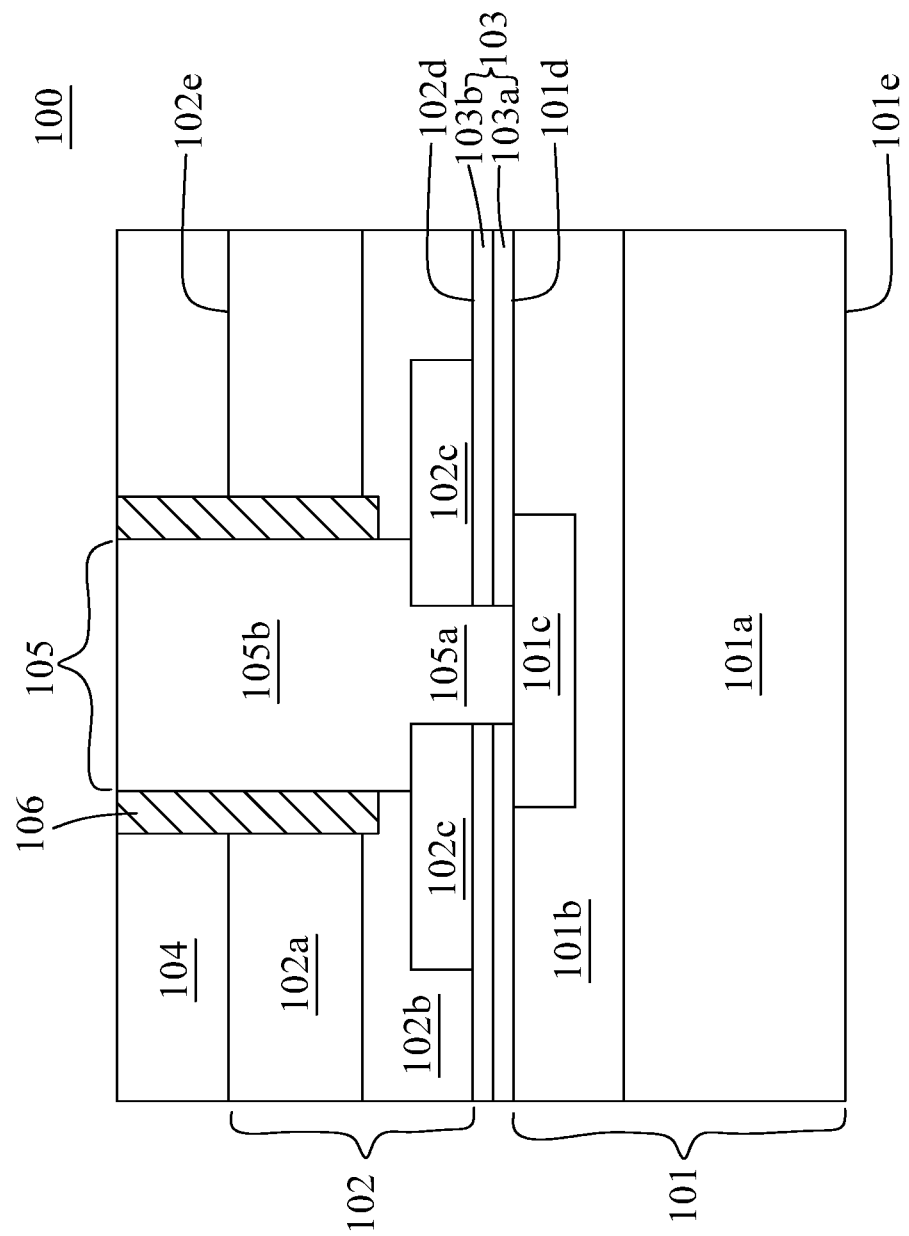

Referring to FIGS. 20 and 21, a conductive material 105' is disposed within the first opening 108 and the second opening 109 to form a conductive via 105 over the first conductive pad 101*c* according to a step S207. In some embodiments, prior to the disposing of the conductive material 105', a diffusion barrier layer is disposed conformal to the first opening 108 and the second opening 109. In some embodiments, the diffusion barrier layer is disposed by ALD, CVD or the like. In some embodiments, the diffusion barrier layer includes titanium, titanium nitride, tantalum, tantalum nitride, nickel or the like.

In some embodiments, after the disposing of the diffusion barrier layer, a seed layer is disposed over the diffusion barrier layer. In some embodiments, the seed layer is disposed by sputtering or another suitable operation. In some embodiments, the seed layer includes titanium, copper, nickel, gold or the like.

In some embodiments, the conductive material 105' is disposed over the second wafer 102 and fills the first opening 108 and the second opening 109 as shown in FIG. 20. In some embodiments, the conductive material 105' is in contact with the dielectric liner 106, the second dielectric layer 102*b*, the second conductive pad 102*c*, the bonding dielectric 103 and the first conductive pad 101*c*. In some embodiments, the conductive material 105' is disposed by electroplating or another suitable operation. In some embodiments, the conductive material 105' includes gold, silver, copper, nickel, tungsten, aluminum, tin, alloys thereof or the like.

In some embodiments, after the disposing of the conductive material 105', a portion of the conductive material 105' on the passivation 104 and the dielectric liner 106 is removed to form a conductive via 105 as shown in FIG. 21. In some embodiments, the conductive material 105' is removed by grinding, etching, CMP or another suitable operation. In some embodiments, the conductive material 105' is planarized to become the conductive via 105. In some embodiments, the top surface of the passivation 104 is substantially coplanar with a top surface of the conductive via 105. In some embodiments, the top surface of the dielectric liner 106 is substantially coplanar with the top surface of the conductive via 105.

In some embodiments, the conductive via 105 extends through the second substrate 102*a*, the second dielectric layer 102*b*, the second conductive pad 102*c* and the bonding dielectric 103. In some embodiments, the dielectric liner 106 is disposed between the conductive via 105 and the second substrate 102*a*. In some embodiments, the dielectric liner 106 is disposed between the conductive via 105 and the passivation 104. In some embodiments, the conductive via 105 has a configuration similar to that of the conductive via described above or illustrated in FIG. 1. In some embodiments, the semiconductor structure 100 is formed as shown in FIG. 21.

In conclusion, a via extending through wafers bonded with each other is formed to electrically connect the wafers. As such, an interconnection density and an overall dimension can be reduced. Furthermore, only one photomask is necessary for forming the via. Therefore, manufacturing cost and materials can be reduced or minimized.

One aspect of the present disclosure provides a semiconductor structure. The semiconductor structure includes a first wafer including a first substrate, a first dielectric layer over the first substrate, and a first conductive pad surrounded by the first dielectric layer; a second wafer including a second dielectric layer, a second substrate over the second dielectric layer, and a second conductive pad surrounded by the second dielectric layer; a bonding dielectric disposed between the first dielectric layer and the second dielectric layer to bond the first dielectric layer with the second dielectric layer; and a conductive via extending from the first conductive pad and surrounded by the bonding dielectric, the second conductive pad and the second wafer.

Another aspect of the present disclosure provides a method of manufacturing a semiconductor structure. The method includes steps of providing a first wafer including a first substrate, a first dielectric layer over the first substrate, and a first conductive pad surrounded by the first dielectric layer; providing a second wafer including a second substrate, a second dielectric layer over the second substrate, and a second conductive pad surrounded by the second dielectric layer; bonding the first dielectric layer with the second dielectric layer; forming a first opening extending through the second substrate and partially through the second dielectric layer; disposing a dielectric liner conformal to the first opening; forming a second opening extending through the second dielectric layer and the second conductive pad to at least partially expose the first conductive pad; and disposing a conductive material within the first opening and the second opening to form a conductive via over the first conductive pad.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor structure, comprising:
    providing a first wafer including a first substrate, a first dielectric layer over the first substrate, and a first conductive pad surrounded by the first dielectric layer and recessed from a first surface of the first dielectric layer, wherein the first conductive pad is formed by removing a portion of the first dielectric layer to form a recess on the first surface of the first dielectric layer and filling a first conductive pad material in the recess, such that the conductive pad is recessed from the first surface of the first dielectric layer;
    providing a second wafer including a second substrate, a second dielectric layer over the second substrate, and a second conductive pad surrounded by the second dielectric layer;
    disposing a passivation over the second substrate;
    bonding the first dielectric layer with the second dielectric layer by a bonding dielectric;
    forming a first opening extending through the second substrate and partially through the second dielectric layer;
    disposing a dielectric liner conformal to the first opening at a position that the dielectric liner is disposed between a conductive via and the second wafer, wherein the dielectric liner is disposed partially through the second dielectric layer, wherein a top surface of the dielectric liner is coplanar with a top surface of the passivation and a top surface of the conductive via; and
    forming a second opening extending through the second dielectric layer and the second conductive pad to at least partially expose the first conductive pad;
    wherein forming the conductive via over the conductive pad by disposing a conductive material within the first opening and the second opening by the steps of:
    forming a first portion of the conductive via through the second opening to the first surface of the first dielectric layer at a position that the first portion of the conductive via is surrounded by the bonding dielectric and the second conductive pad and not exposed to the second dielectric layer; and
    coupling a second portion of the conductive via with the first portion thereof at a position that the second portion of the conductive via is surrounded by the second dielectric layer and the second substrate, wherein the dielectric liner is sandwiched between the second portion of conductive via and the passivation.

2. The method of claim 1, wherein the conductive via extends through the second substrate, the second dielectric layer and the second conductive pad, wherein a bottom surface of the dielectric liner is spaced apart from a top surface of the second conductive pad.

3. The method of claim 1, wherein the first surface of the first dielectric layer is bonded with a second surface of the second dielectric layer by the bonding dielectric, wherein the first conductive pad is at least partially in contact with the bonding dielectric.

4. The method of claim 3, wherein the second opening and the conductive via extend through the bonding dielectric.

5. The method of claim 1, wherein the second wafer is flipped prior to the bonding of the first dielectric layer with the second dielectric layer.

6. The method of claim 1, wherein the dielectric liner is disposed between the conductive via and the second substrate.

7. The method of claim 1, wherein the first opening extends through the passivation, wherein an outer surface of the second portion of the conductive via is in direct contact with an inner surface of the dielectric liner.

8. The method of claim 7, wherein the dielectric liner is disposed between the conductive via and the passivation, wherein the dielectric liner is direct contact between the conductive via and the passivation.

9. The method of claim 1, wherein the formation of the first opening includes disposing a patterned photoresist over the second wafer and removing the second substrate and the second dielectric layer exposed through the patterned photoresist.

10. The method of claim 9, wherein the dielectric liner covers the patterned photoresist.

11. The method of claim 10, wherein the dielectric liner covering the patterned photoresist and a portion of the patterned photoresist are removed during the formation of the second opening.

12. The method of claim 11, wherein the patterned photoresist is removed after the formation of the second opening.

13. The method of claim 1, further comprising reducing a thickness of the second substrate by grinding after the bonding of the first dielectric layer with the second dielectric layer.

* * * * *